(12) United States Patent
Andre et al.

(10) Patent No.: US 12,155,356 B2
(45) Date of Patent: Nov. 26, 2024

(54) MONOLITHIC MICROWAVE INTEGRATED CIRCUIT DEVICE WITH INTERNAL DECOUPLING CAPACITOR

(71) Applicant: MACOM Technology Solutions Holdings, Inc., Lowell, MA (US)

(72) Inventors: Ulf Hakan Andre, Hillsborough, NC (US); Kevin Cen, Chapel Hill, NC (US)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 500 days.

(21) Appl. No.: 17/517,828

(22) Filed: Nov. 3, 2021

(65) Prior Publication Data

US 2023/0136967 A1    May 4, 2023

(51) Int. Cl.
*H03F 3/213* (2006.01)
*H03F 1/56* (2006.01)
*H03F 3/195* (2006.01)

(52) U.S. Cl.
CPC ....... *H03F 3/213* (2013.01); *H03F 2200/451* (2013.01)

(58) Field of Classification Search
CPC ............... H03F 3/213; H03F 2200/451; H03F 2200/318; H03F 1/565; H03F 1/0288; H03F 3/195; H03F 3/245; H01L 2223/6611; H01L 2223/6644; H01L 2223/665; H01L 2223/6655; H01L 2223/6683; H01L 23/66
USPC .......................................... 330/307, 310, 302
See application file for complete search history.

(56) References Cited

U.S. PATENT DOCUMENTS 11,228,287 B2 *    1/2022    Chidurala ............... H03F 1/565

* cited by examiner

*Primary Examiner* — Hieu P Nguyen
(74) *Attorney, Agent, or Firm* — Sage Patent Group

(57) ABSTRACT

A power amplifier according to some embodiments includes a submount, a monolithic microwave integrated circuit (MMIC) die on the submount, the MMIC die including an RF transistor configured to operate at frequencies greater than 26.5 GHz, and an internal decoupling capacitor on the submount and connected to a drain of the RF transistor. The internal decoupling capacitor has a capacitance greater than 2 nF.

17 Claims, 12 Drawing Sheets

MONOLITHIC MICROWAVE INTEGRATED CIRCUIT DEVICE WITH INTERNAL DECOUPLING CAPACITOR

FIELD

The disclosure relates to monolithic microwave integrated circuit (MMIC) devices, and in particular to MMIC devices having an operating frequency between 26.5 GHz and 40 GHz.

BACKGROUND

FIG. 1 is a plan view of a conventional MMIC RF transistor amplifier 400 according to embodiments of the present inventive concepts. As shown in FIG. 1, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic or plastic material.

The package 410 includes an input lead 412 and an output lead 418. The input lead 412 may be mounted to an input lead pad 414 by, for example, soldering. One or more input bond wires 420 may electrically connect the input lead pad 414 to an input bond pad on the integrated circuit chip 430. The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482. The package 410 also includes a decoupling network 490 for supplying DC bias voltage to the gate (VG) and drain (VD). The decoupling network 490 may include a plurality of capacitors. The function of the decoupling network 490 is to provide stable operation when multiple stages are connected to the same gate and drain supply voltages.

The package 410 further includes an output lead 418 that is connected to an output lead pad 416 by, for example, soldering. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present inventive concepts.

An RF transistor amplifier may be designed to operate in a wide variety of different frequency bands. For example, RF transistor amplifiers may be configured to operate in at least one of the 0.6-2.7 GHz, 3.4-4.2 GHz, 5.1-5.8 GHz, 12-18 GHz, 18-27 GHz, 27-40 GHz or 40-75 GHz frequency bands or sub-portions thereof.

An important figure of merit for high frequency MMIC amplifiers is video bandwidth. Video Bandwidth (VBW) indicates the ability of a nonlinear power amplifier (PA) to maintain a low-level Adjacent Channel Leakage Ratio (ACLR) or Intermodulation Distortion (IMD) products as a function of the frequency spread or spacing ($\Delta f$) of an input signal.

In the most general case, the input signal consists of a multicarrier signal, such as an orthogonal frequency division multiplexing (OFDM) signal, or a wideband signal such as a wideband code division multiple access (WCDMA) signal. In this case, ACLR should be plotted against the bandwidth of the input signal.

For the simplest case, the input signal consists of a two-tone signal. In that case, IMDn (e.g., IMD3, IMD5, etc.) may be plotted against the two-tone spacing ($\Delta f$) of the signal. Conventionally, VBW is characterized by a plot of IMD3 vs two-tone spacing. VBW is a particularly important design requirement for wireless transmission systems in which wideband or multichannel signals are amplified using PAs prior to transmission. Examples of such transmission systems include satellite communication systems (Satcom) and wideband TV broadcasting systems.

When a PA is excited with two tones (e.g., f1, f2), the resulting output usually consists of combinations of different harmonics at frequencies $n \times f1 \pm m \times f2$. Where n and m are the integers 1, 2, 3, etc. The frequencies at 2f2-f1 and 2f1-f2 are referred to as the upper and lower IM3 tones. The harmonics at frequency f2-f1 is a low frequency signal close to DC, referred to as the VBW frequency.

SUMMARY

A power amplifier according to some embodiments includes a submount, a monolithic microwave integrated circuit (MMIC) die on the submount, the MMIC die including an RF transistor configured to operate at frequencies greater than 26.5 GHz, and an internal decoupling capacitor on the submount and connected to a drain of the RF transistor. The internal decoupling capacitor has a capacitance greater than 2 nF.

The power amplifier may include a multi-stage amplifier including a first stage and a second stage. The RF transistor may include a first RF transistor in the first stage of the power amplifier and the power amplifier further may include a second RF transistor in the second stage of the power amplifier. The internal decoupling capacitor may be further connected to a drain of the second RF transistor. The power amplifier may include a third stage having a third RF transistor, and the internal decoupling capacitor may be further coupled to a drain of the third RF transistor.

The internal decoupling capacitor may include a single layer capacitor, and the RF transistor may include a Group III-nitride based high electron mobility transistor. The internal decoupling capacitor may have a capacitance of 10 nF or less and/or may have a voltage rating greater than 50 V.

The power amplifier may have a peak output power greater than 37 dBm at an operating frequency between 26.5 GHz and 40 GHz. The power amplifier may have a peak output power greater than 37 dBm at an operating frequency between 27 GHz and 31 GHz. The power amplifier may have a intermodulation distortion product of less than −20 dB over a tone spacing from 0.1 GHz to 300 MHz. The power amplifier may have a video bandwidth greater than 300 MHz at an operating frequency between 26.5 GHz and 40 GHz.

The internal decoupling capacitor may include a first decoupling capacitor, and the power amplifier may include a second internal decoupling capacitor coupled to a drain of the RF transistor. The second internal decoupling capacitor may have a capacitance greater than 2 nF. The second internal decoupling capacitor may be a single layer capacitor.

The power amplifier may include a multi-stage amplifier including a first stage and a second stage. The RF transistor may include a first RF transistor in the first stage of the power amplifier and the power amplifier further may include a second RF transistor in the second stage of the power amplifier. The first internal decoupling capacitor and the second internal decoupling capacitor may be further connected to a drain of the second RF transistor. The power amplifier may include a third stage having a third RF transistor, and the first and second internal decoupling capacitors may be further connected to a drain of the third RF transistor. The first and second internal decoupling capacitors may be on opposite sides of the RF transistor on the submount.

A method of forming a power amplifier according to some embodiments includes mounting a monolithic microwave integrated circuit (MMIC) die on a submount, the MMIC die including an RF transistor configured to operate at frequencies greater than 26.5 GHz, mounting an internal decoupling capacitor on the submount, wherein the internal decoupling capacitor has a capacitance greater than 2 nF, and connecting the decoupling capacitor to a drain of the RF transistor.

The internal decoupling capacitor may include a first internal decoupling capacitor, and the method may further include mounting a second internal decoupling capacitor on the submount and connecting the second internal decoupling capacitor to the drain of the RF transistor. The second internal decoupling capacitor has a capacitance greater than 2 nF.

The power amplifier may include a multi-stage amplifier including a first stage and a second stage. The RF transistor includes a first RF transistor in the first stage of the power amplifier and the power amplifier may further include a second RF transistor in the second stage of the power amplifier. The method may further include connecting the internal decoupling capacitor to a drain of the second RF transistor.

A power amplifier according to some embodiments includes a submount, a monolithic microwave integrated circuit (MMIC) die on the submount, the MMIC die including an RF transistor configured to operate at frequencies greater than 26.5 GHz, an input matching circuit coupled to a gate of the RF transistor, and an output matching circuit coupled to a drain of the RF transistor, and an internal decoupling capacitor on the submount and connected to the drain of the RF transistor, wherein the internal decoupling capacitor has a capacitance greater than 2 nF.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
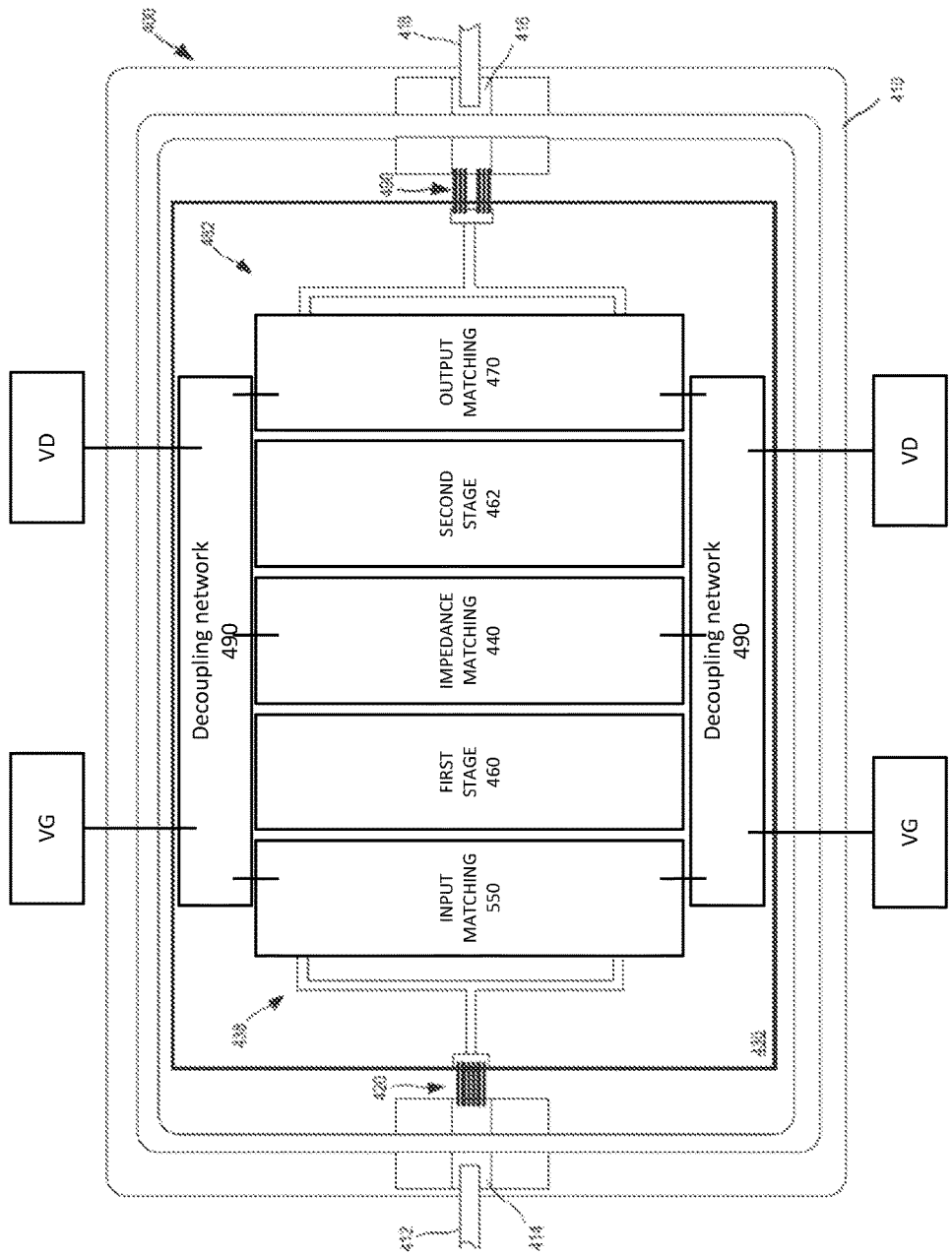
FIG. 1 is a schematic illustration of a conventional MMIC amplifier including a GaN HEMT transistor.

Embodiments of the inventive concepts are explained more fully with reference to the non-limiting aspects and examples that are described and/or illustrated in the accompanying drawings and detailed in the following description. It should be noted that the features illustrated in the drawings are not necessarily drawn to scale, and features of some embodiments may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Since a field effect transistor (FET), such as a Group III-nitride high electron mobility transistor (HEMT), used in a MMIC power amplifier, is a current source, the resulting signal will be in the form of currents at the mentioned harmonic frequencies. If the VBW currents are not well terminated, a low frequency voltage swing on top of the DC bias voltage demodulates the main signal, resulting in additional distortion on top of the normal IM3 components which in turn affects the VBW of the PA.

Having a high VBW in a high-power PA may allow for higher data rates to be transmitted using a single PA in a wireless communication system. To obtain a good VBW, it is desirable for a PA to be decoupled at DC or the VBW frequency, with a wideband resonance free low impedance at the drain, and possibly the gate. Decoupling is conventionally achieved via a capacitor network including a plurality of capacitors coupled to the drain terminals of transistors in a PA. The capacitor network typically includes an on-chip component, an in-package, or internal, component and an off-package component. The on-chip component of the decoupling network provides RF matching and initial decoupling. The internal component, which includes capacitors provided within the package but not on-chip, provides most of the decoupling. Additional decoupling may be provided by the off-package component, which may include capacitors mounted on a printed circuit board (PCB) on which the package is mounted.

Figure 2:
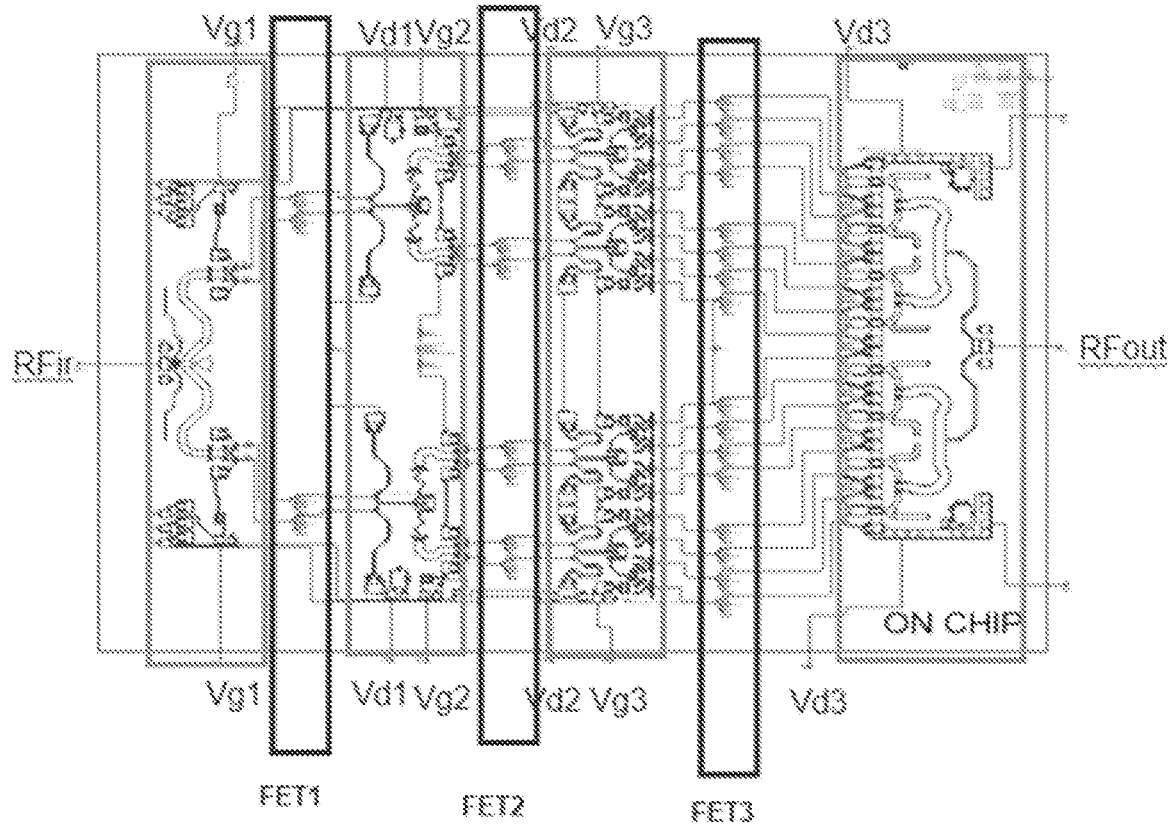
FIG. 2 is a schematic layout of a conventional multistage MMIC.
Figure 3:
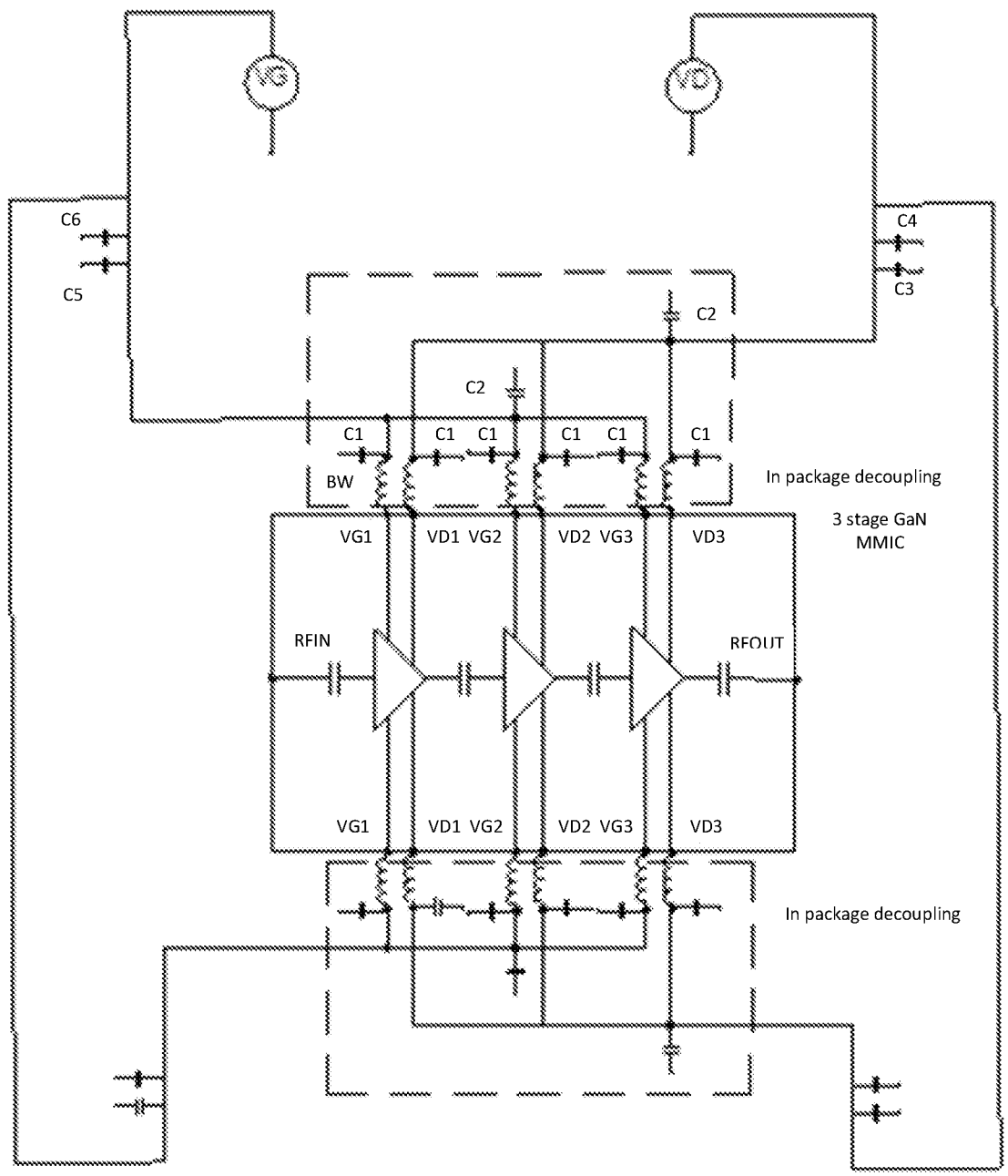
FIG. 3 is a schematic circuit diagram of a conventional multistage MMIC.
Figure 4:
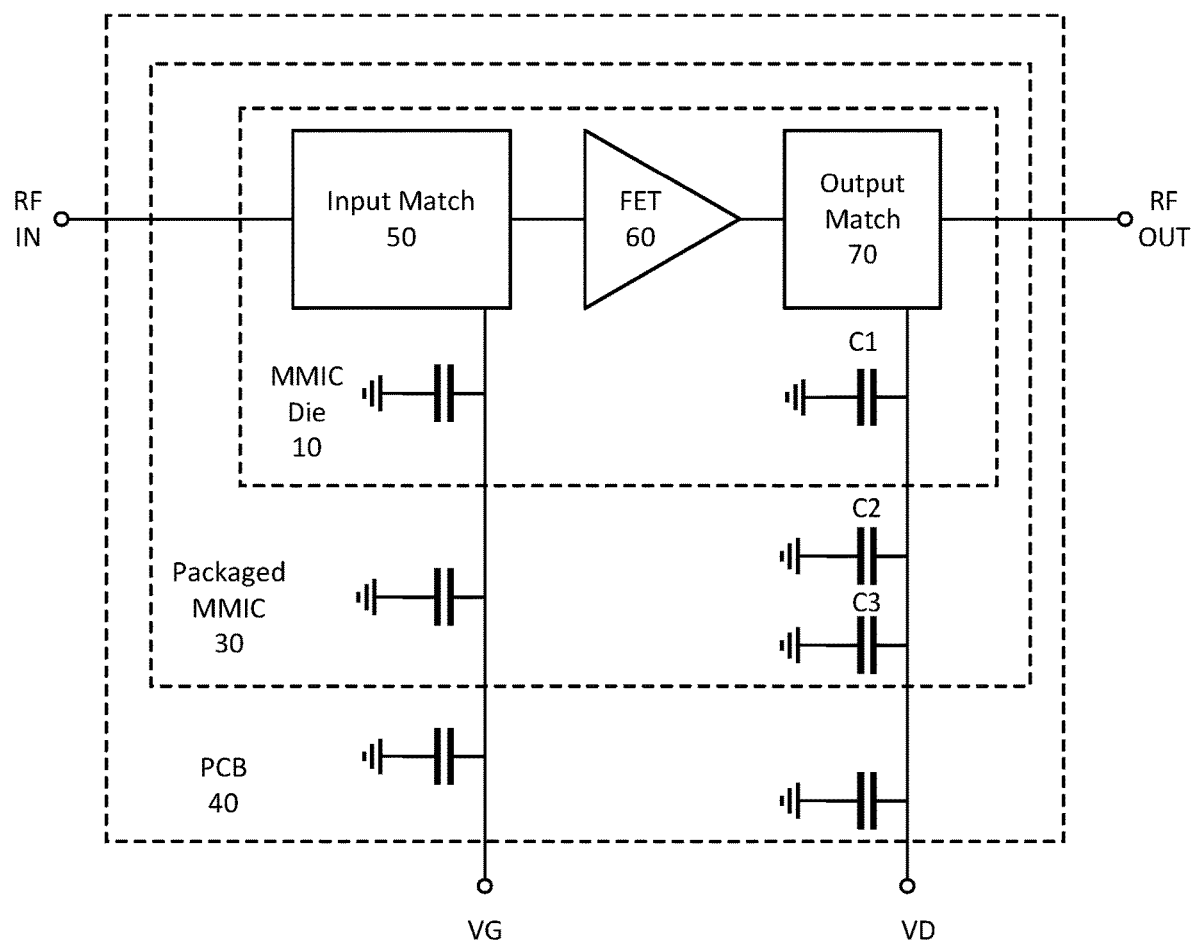
FIG. 4 is a schematic block diagram of a conventional multistage MMIC.

FIG. 2 is a schematic layout, and FIG. 3, which is a schematic circuit diagram of a conventional package MMIC based PA, including an internal VBW decoupling circuit, with larger components located on a PCB. The PA illustrated in FIGS. 2 and 3 includes three amplification stages provided by three HEMT field effect transistors (FETS), namely FET1, FET2, and FET3. An RF input provides an input RF signal via an input matching network to FET1. An RF output signal is output by FET3. Each FET has a gate biased by a gate bias signal $Vg1$, $Vg2$, $Vg3$ and a drain biased by a drain bias signal $Vd1$, $Vd2$, $Vd3$. An on-chip decoupling and match circuit includes capacitors C1 and C2 coupled to the gates and drains of each FET. In a conventional approach, the on-chip capacitor (C1) is located on the MMIC die. C2 is the first internal capacitor and is located close to the MMIC die 10. C2 has a typical capacitance of about 50 pF to 100 pF. The second capacitor (C3) is typically located off-chip either within the package or on the printed circuit board (PCB) and has a typical capacitance of about 500 pF to 1000 pF. This arrangement is illustrated schematically for a single-stage PA in FIG. 4. As shown therein, a MMIC 10 includes a field effect transistor 60 formed on a MMIC chip (or die) 10. The MMIC die 10 is packaged within a package 30 and mounted on a PCB 40. An input RF signal is applied to the FET 60 through an input impedance matching circuit 50. An output impedance matching circuit 70 is coupled to the output of the FET 60. A gate bias voltage signal VG is applied to the input of the FET 60, and a drain bias voltage signal VD is applied to the output (drain) of the FET 60. An on-chip decoupling capacitor C1 and a first off-chip decoupling capacitor C2 are connected to the drain of the FET 60. The on-chip decoupling capacitor C1 is provided on the chip substrate 30, while the internal decoupling capacitor C2 is provided within the package 30. Additional decoupling capacitors may be provided outside the package 30, such as on a PCB 40. C2 is provided internal to the package 30 and connected with wire bonds. The goal is to place C2 close to the MMIC die 10 to reduce inductance which add to the impedance.

Figure 5:
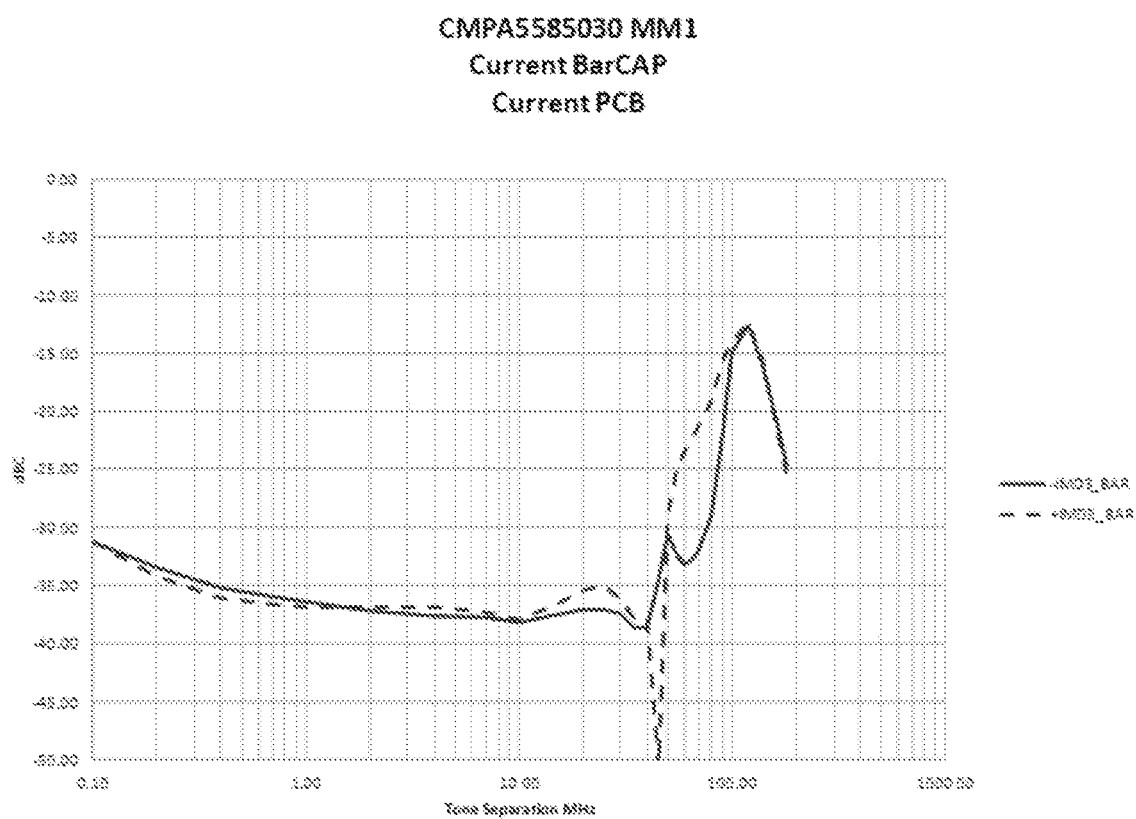
FIG. 5 is a graph of IMD3 versus frequency spacing for a conventional multistage MMIC.

An example plot of IMD3 as a function of two-tone frequency separation ($\Delta f$) of an input signal is for a conventional GaN HEMT MMIC is shown in FIG. 5, where the dashed line represents upper IMD3 (+IMD3) and the solid line represents lower IMD3 (−IMD3). As seen in FIG. 5, the IMD3 characteristic increases substantially above −25 dBc at a frequency separation of about 50 MHz, indicating that the device has a VBW of about 50 MHz.

Some embodiments provide a single layer decoupling capacitor that is coupled the drain of the FET. The single layer decoupling capacitor may be an internal capacitor. In particular, the single layer on-chip decoupling capacitor may have a capacitance that is large enough for operation at KA band frequencies (26.5 GHz to 40 GHz). For example, a single layer internal decoupling capacitor according to some embodiments may have a capacitance of 2 nF or greater. In some embodiments, the internal decoupling capacitor may have a capacitance of 10 nF or less.

In some embodiments, multiple single layer internal decoupling capacitors may be coupled to a MMIC FET. For example, single layer internal decoupling capacitors may be coupled on opposite sides of a MMIC die 10. Moreover, the single layer internal decoupling capacitors may be coupled to drains of FETs in multiple stages of a MMIC power amplifier, rather than providing separate decoupling capacitors for the different stages of the amplifier.

Figure 6:
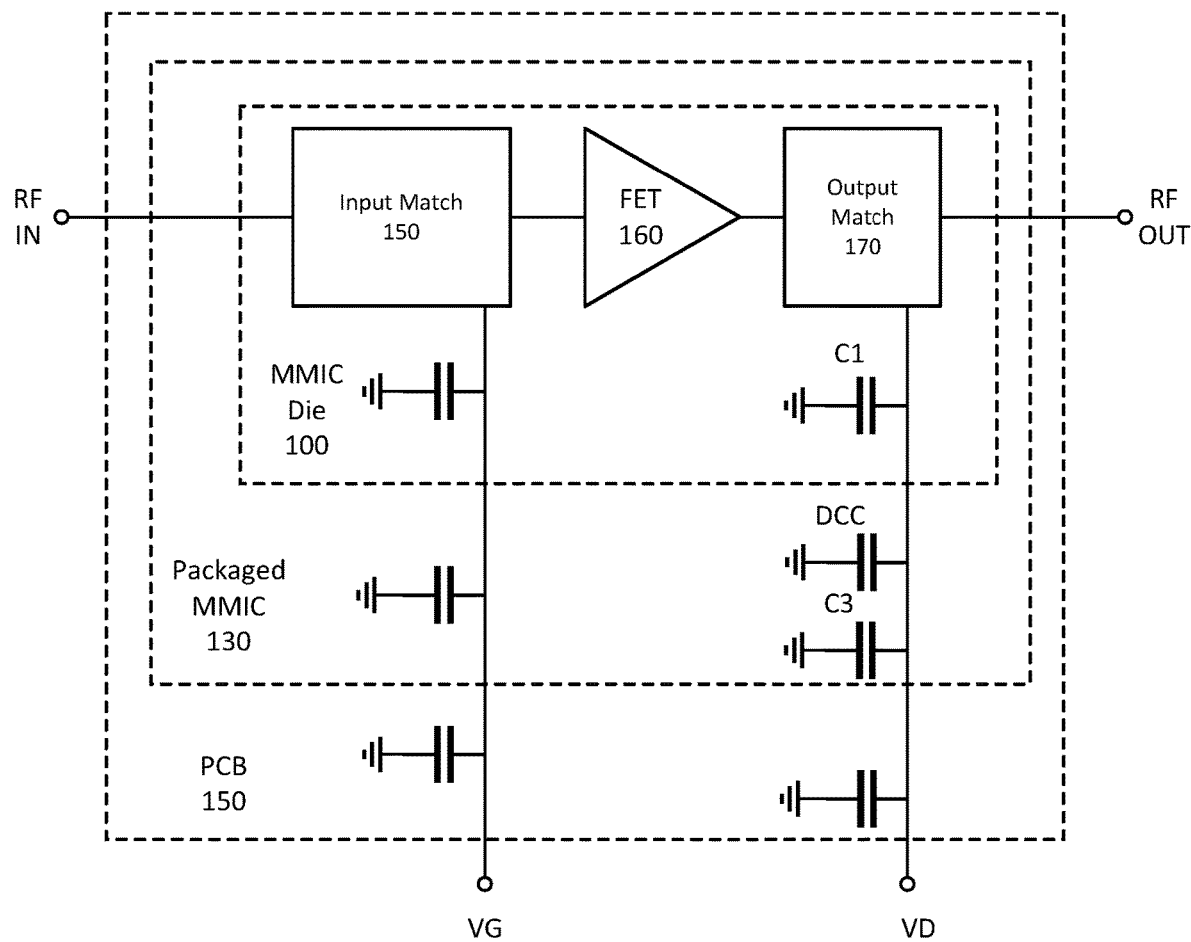
FIG. 6 is a schematic block diagram of a MMIC device according to some embodiments.

An example arrangement according to some embodiments is illustrated schematically for a single-stage PA including a single stage internal decoupling capacitor in FIG. 6. As shown therein, a packaged MMIC 130 includes a field effect transistor 160 formed on a MMIC chip or die 100. An input RF signal is applied to the FET 160 through an input impedance matching circuit 150. An output impedance matching circuit 170 is coupled to the output of the FET 160. A gate bias voltage signal VG is applied to the input of the FET 160, and a drain bias voltage signal VD is applied to the output (drain) of the FET 160. An internal decoupling capacitor DCC is provided in the MMIC package 130 and is connected to the drain of the FET 160. The internal decoupling capacitor DCC has a capacitance of 2 nF or greater.

Figure 7A:
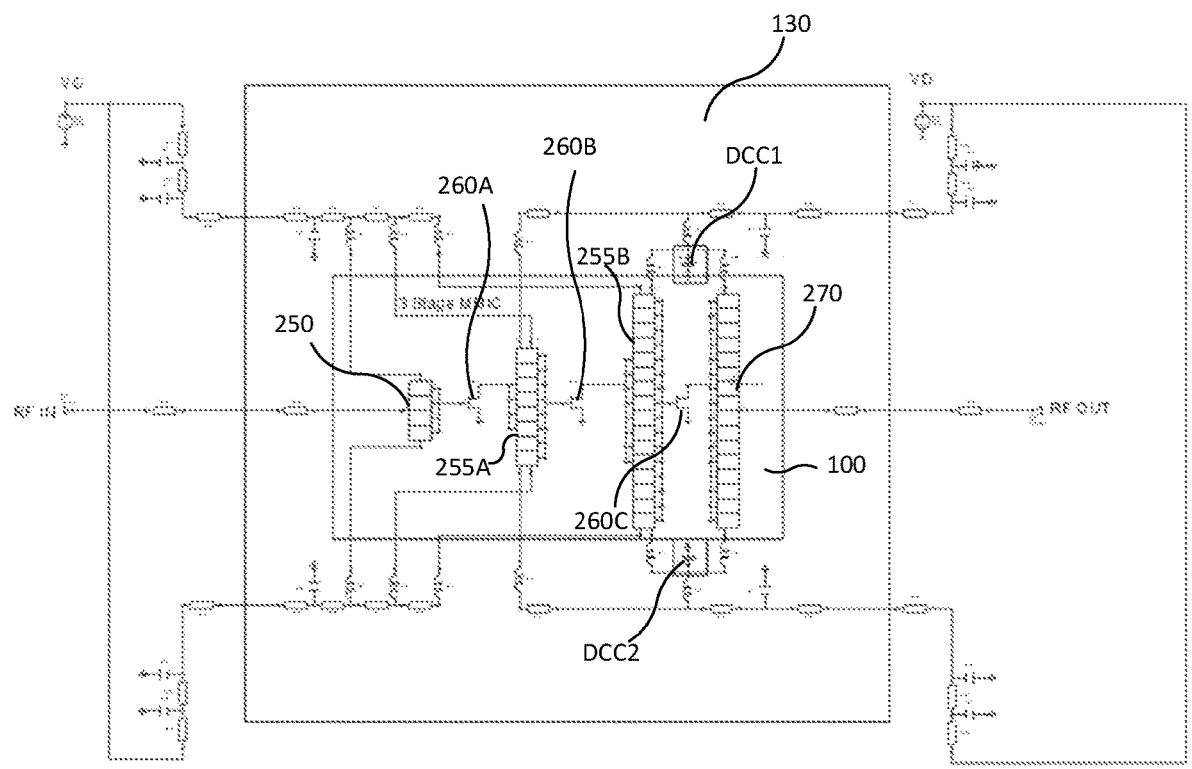
FIG. 7A is a schematic circuit diagram of a multistage MMIC according to some embodiments.
Figure 7B:
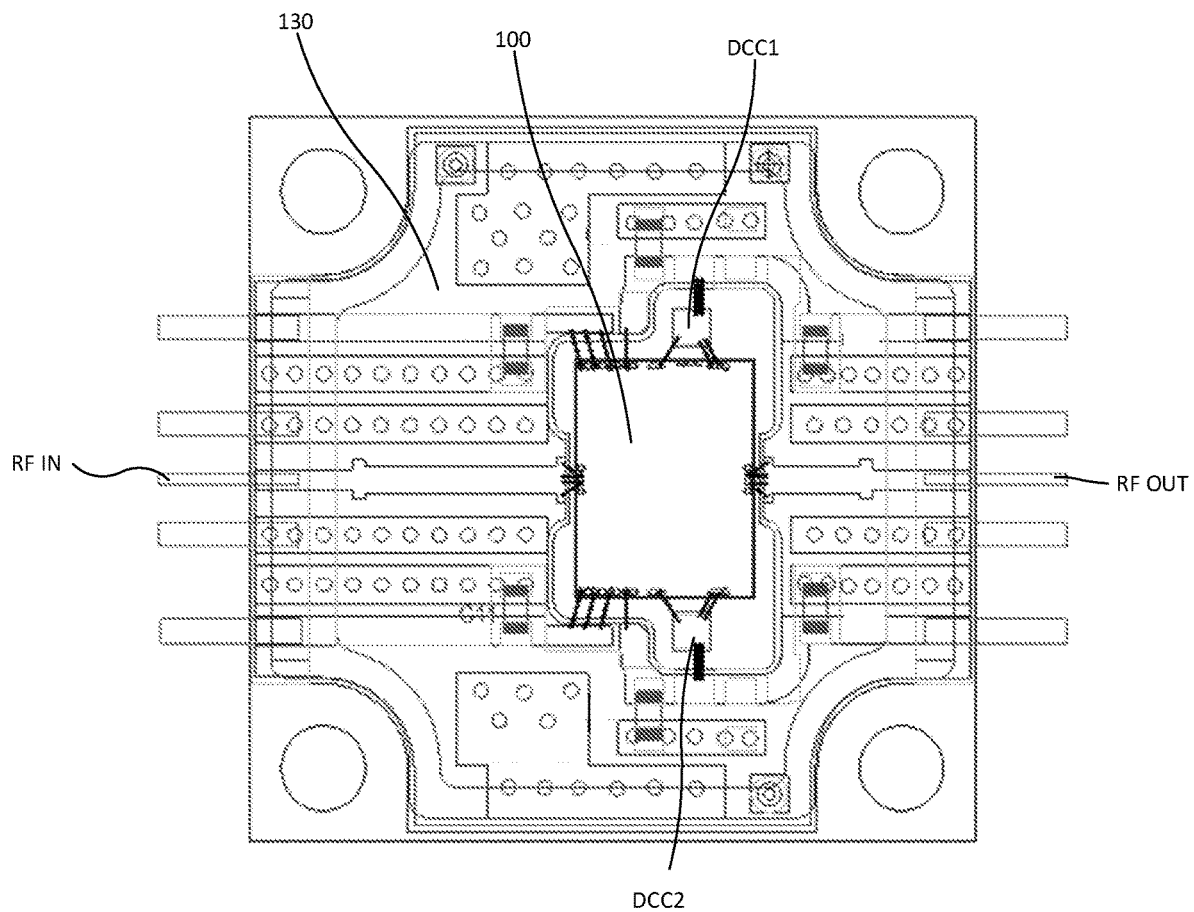
FIG. 7B is a schematic layout of a multistage MMIC according to some embodiments.

FIG. 7A is a schematic circuit diagram and FIG. 7B is a schematic layout diagram of a multistage PA including dual single stage on-chip decoupling capacitors according to some embodiments. As shown therein, a packaged MMIC amplifier 130 includes first, second and third stage field effect transistors 260A, 260NB, 260C formed on a MMIC die 100. An input RF signal is applied to the first stage FET 260A through an input impedance matching circuit 250. The output of the first stage FET 260A is coupled to the input of the second stage FET 260B through a first interstage impedance matching circuit 255A. The output of the second stage FET 260B is coupled to the input of the third stage FET 260C through a second interstage impedance matching circuit 255B. An output impedance matching circuit 270 is coupled to the output of the third stage FET 260A. A gate bias voltage signal VG is applied to the respective inputs of the FETs 260A, 260B, 260C, and a drain bias voltage signal VD is applied to the outputs (drains) of the FETs 260A, 260B, 260C. A first internal decoupling capacitor DCC1 is connected to the drains of the FETs 260A, 260B, 260C on a first side of the FETs 260A, 260B, 260C and a second internal decoupling capacitor DCC2 is connected to the drains of the FETs 260A, 260B, 260C on a second side of the FETs 260A, 260B, 260C, opposite the first side. The internal decoupling capacitors DCC1, DCC2 are provided within the same package as the MMIC die 100, and each of the internal decoupling capacitors DCC1, DCC2 has a capacitance of 2 nF or greater.

Figure 8A:
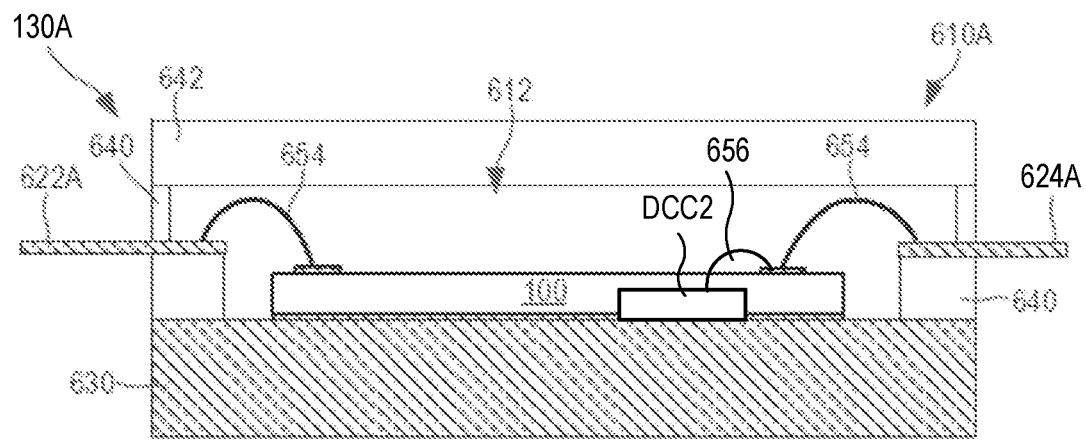
FIGS. 8A and 8B illustrate packaged MMICs according to some embodiments.

FIG. 8A is a schematic side view of a packaged MMIC RF transistor amplifier 130A. As shown in FIG. 8A, packaged RF transistor amplifier 130A includes a MMIC die 100 packaged in an open cavity package 610A. The package 130A includes metal gate leads 622A, metal drain leads 624A, a metal submount 630, sidewalls 640 and a lid 642.

The submount 630 may include materials configured to assist with the thermal management of the package 130A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials.

In some embodiments, the sidewalls 640 and/or lid 642 may be formed of, for example, $Al_2O_3$. The lid 642 may be glued to the sidewalls 640 using an epoxy glue. The sidewalls 640 may be attached to the submount 630 via, for example, braising. The gate lead 622A and the drain lead 624A may be configured to extend through the sidewalls 640, though embodiments of the present inventive concepts are not limited thereto.

The MMIC die 100 is mounted on the upper surface of the metal submount 630 in an air-filled cavity 612 defined by the metal submount 630, the ceramic sidewalls 640 and the ceramic lid 642. The gate and drain terminals of MMIC die 100 may be on the top side of the structure, while the source terminal is on the bottom side of the structure.

The gate lead 622A may be connected to the gate terminal of MMIC die 100 by one or more bond wires 654. Similarly, the drain lead 624A may be connected to the drain terminal of MMIC die 100 by one or more bond wires 654. The source terminal may be mounted on the metal submount 630 using, for example, a conductive die attach material (not shown). The metal submount 630 may provide the electrical connection to the source terminal 126 and may also serve as a heat dissipation structure that dissipates heat that is generated in the RF transistor amplifier die 100.

The heat is primarily generated in the upper portion of the MMIC die 100 where relatively high current densities are generated in, for example, the channel regions of the unit cell transistors. This heat may be transferred though the source vias 146 and the semiconductor layer structure of the device to the source terminal and then to the metal submount 630.

A decoupling capacitor DCC2 is mounted on the submount 30 alongside the MMIC die 100 and is attached to the drain of the MMIC die 100 via a wirebond 656.

Figure 8B:
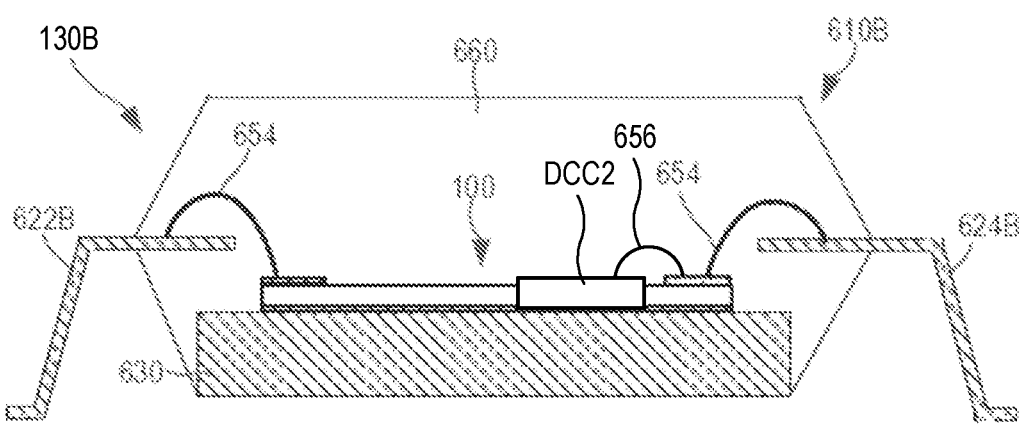

FIG. 8B is a schematic side view of another packaged MMIC RF transistor amplifier 130B. The MMIC transistor amplifier 130B differs from the MMIC RF transistor amplifier 130A in that it includes a different package 610B. The packaged MMIC RF transistor amplifier 130B includes a metal submount 630, as well as metal gate and drain leads 622B, 624B. The packaged MMIC RF transistor amplifier 130B also includes a plastic overmold 660 that at least partially surrounds the RF transistor amplifier die 100, the leads 622B, 624B, and the metal submount 630.

Figure 9:
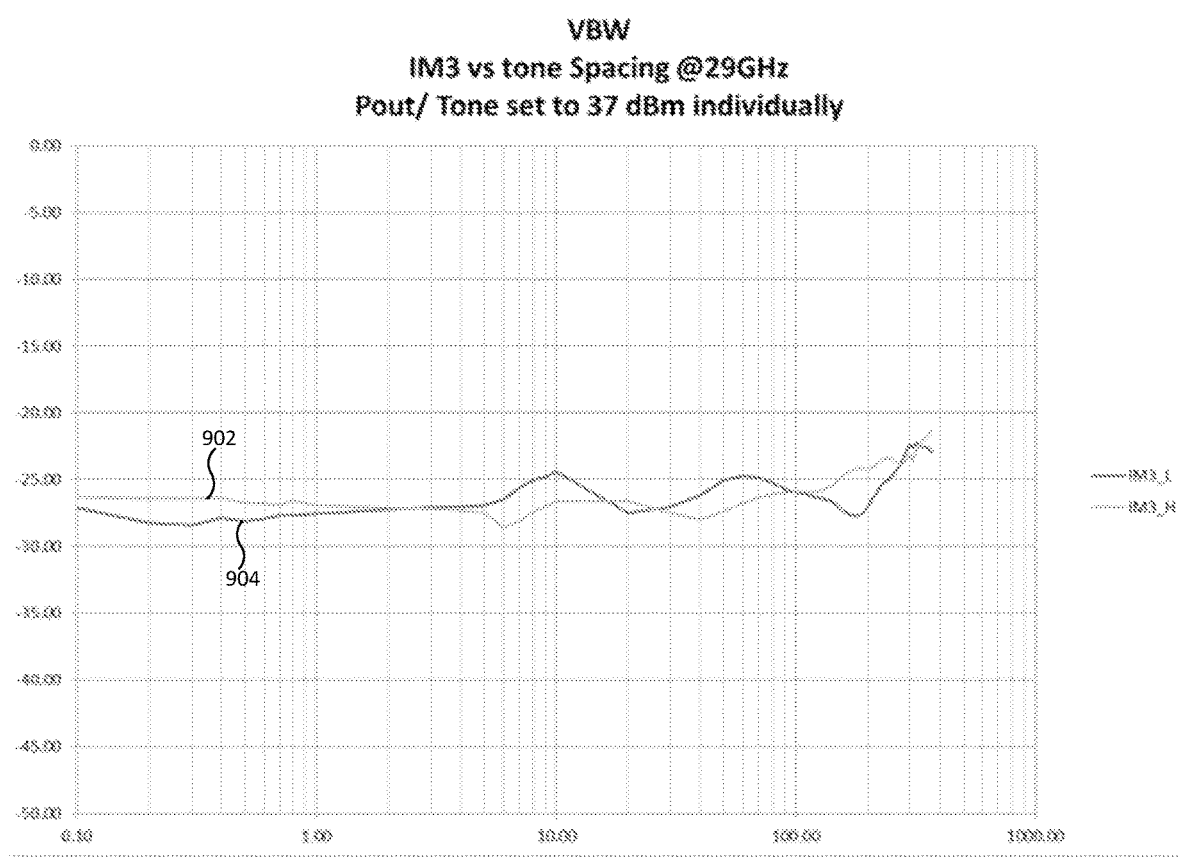
FIG. 9 is a graph of IMD3 versus frequency spacing for a MMIC according to some embodiments.

A measured plot of IMD3 as a function of two-tone frequency separation ($\Delta f$) of an input signal is for a GaN HEMT MMIC 210 is shown in FIG. 9, where curve 902 represents upper IMD3 (+IMD3) and curve 904 represents lower IMD3 (−IMD3). As seen in FIG. 9, the IMD3 characteristic remains below −22 dBc at a frequency separation of above 300 MHz, indicating that the device has a VBW of about at least about 100 MHz.

Figure 10:
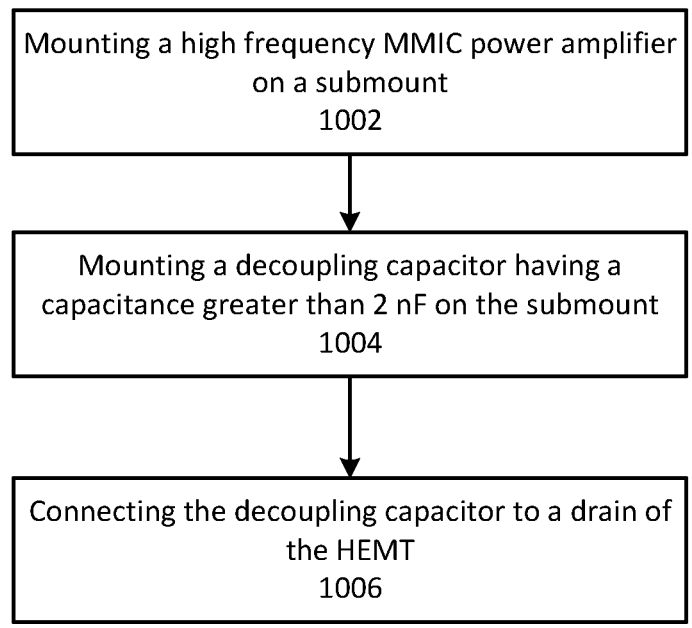
FIG. 10 is a flowchart of operations for forming a MMIC according to some embodiments.

FIG. 10 illustrates operations for forming a packaged MMIC power amplifier according to some embodiments. Referring to FIG. 10, a method of forming a packaged MMIC power amplifier includes mounting a high electron mobility transistor (HEMT) configured to operate at frequencies greater than 26.5 GHz on a submount (block 1002), and mounting an internal decoupling capacitor on the submount, wherein the internal decoupling capacitor has a capacitance greater than 2 nF (block 1004). The method further includes connecting the internal decoupling capacitor to a drain of the HEMT (block 1006).

The internal decoupling capacitor may include a first internal decoupling capacitor, and the method may further include forming a second internal decoupling capacitor in the package, wherein the second internal decoupling capacitor has a capacitance greater than 2 nF, and connecting the second decoupling capacitor to the drain of the HEMT. The power amplifier may be a multi-stage amplifier including a first stage and a second stage, where the HEMT includes a first HEMT in the first stage of the power amplifier and a second HEMT in the second stage of the power amplifier. The method may further include connecting the internal decoupling capacitor to a drain of the second HEMT.

Devices as described herein may be used in amplifiers that operate in a wide variety of different frequency bands. In some embodiments, the RF transistor amplifiers incorporating transistor devices as described herein may be configured to operate at frequencies greater than 1 GHz. In other embodiments, the RF transistor amplifiers may be configured to operate at frequencies greater than 2.5 GHz. In still other embodiments, the RF transistor amplifiers may be configured to operate at frequencies greater than 3.1 GHz. In yet additional embodiments, the RF transistor amplifiers may be configured to operate at frequencies greater than 5 GHz. In some embodiments, the RF transistor amplifiers may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the inventive concepts have been discussed above with respect to HEMT devices, it will be understood that the inventive concepts described herein may be applied to other types of semiconductor devices, such as MOSFETs, DMOS transistors, GaAs MMICs, CMOS, and/or laterally diffused MOS (LDMOS) transistors.

RF transistor amplifiers incorporating transistor devices described herein can be used in standalone RF transistor amplifiers and/or in multiple RF transistor amplifiers. Examples of how the RF transistor amplifiers according to some embodiments may be used in applications that include multiple amplifiers will be discussed with reference to FIGS. 11A-11C.

Figure 11A:
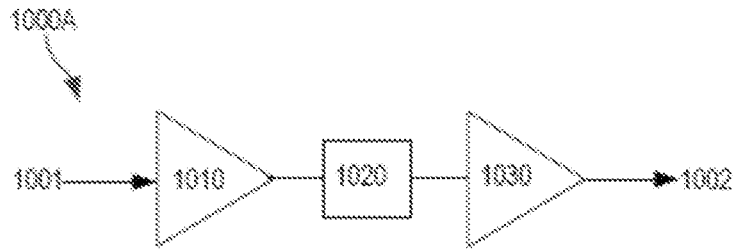
FIGS. 11A-11C are schematic block diagrams of multi-amplifier circuits in which RF transistor amplifiers incorporating transistor devices according to embodiments may be used.

Referring to FIG. 11A, an RF transistor amplifier 1000A is schematically illustrated that includes a pre-amplifier 1010 and a main amplifier 1030 that are electrically connected in series. As shown in FIG. 11A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 11A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 11B:
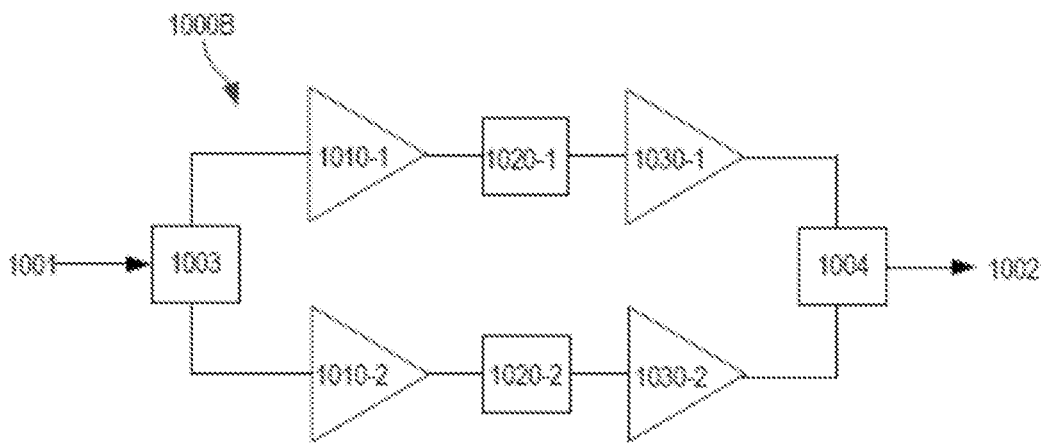

Referring to FIG. 11B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 9A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 11C:
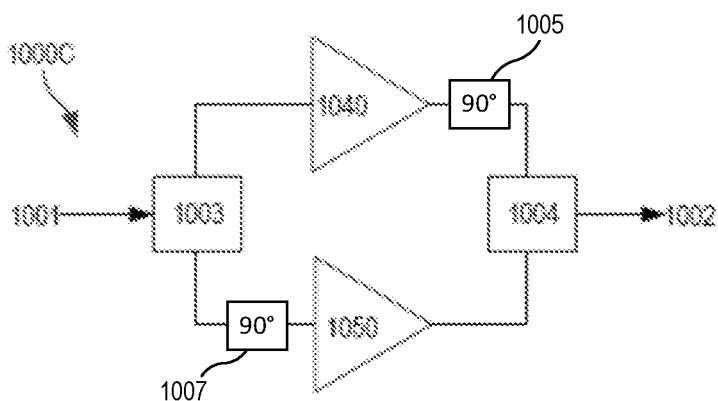

As shown in FIG. 11C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 11C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

A transistor device according to some embodiments may be utilized in power semiconductor devices and/or applications. In some embodiments, the power semiconductor devices may be utilized for a power module that may include structure optimized for state-of-the-art wide band gap power semiconductor devices such as Gallium Nitride (GaN) or other Group III-nitride materials, Silicon Carbide (SiC), and the like, which are capable of carrying high amounts of currents and voltages and switching at increasingly faster speeds in comparison with established technologies. The power devices may include Wide Band Gap (WBG) semiconductors, including Gallium Nitride (GaN), Silicon Carbide (SiC), and the like, and offer numerous advantages over conventional Silicon (Si) as a material for the power devices. Nevertheless, various aspects of the disclosure may utilize Si type power devices and achieve a number of the benefits described herein.

A transistor device according to some embodiments may be utilized in radio frequency (RF) applications. In particular, a transistor device according to some embodiments may be utilized in wireless base stations that connect to a wireless device. In further aspects, the transistor device may be utilized in in wireless communication devices.

In aspects, the dimensions of z and/or d may be critical in order to address extreme temperature ranges, humidity ranges, and/or a host of other environmental conditions; operation at or near rated currents and voltages over extended periods of time; and address manufacturing issues such as insufficiently optimized wire bonding processes as well as others.

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the invention should not be limited to the specific embodiments described above.

The invention claimed is:

1. A power amplifier comprising:
a submount;
a monolithic microwave integrated circuit (MMIC) die on the submount, the MMIC die comprising an RF transistor configured to operate at frequencies greater than 26.5 GHz;
a first internal decoupling capacitor on the submount and connected to a drain of the RF transistor, wherein the first internal decoupling capacitor has a capacitance greater than 2 nF; and
a second internal decoupling capacitor coupled to a drain of the RF transistor, wherein the second internal decoupling capacitor has a capacitance greater than 2 nF;
wherein the first and second internal decoupling capacitors are on opposite sides of the RF transistor.

2. The power amplifier of claim 1, wherein the power amplifier comprises a multi-stage amplifier including a first stage and a second stage, wherein the RF transistor comprises a first RF transistor in the first stage of the power amplifier and the power amplifier further comprises a second RF transistor in the second stage of the power amplifier, wherein the first internal decoupling capacitor is further connected to a drain of the second RF transistor.

3. The power amplifier of claim 2, wherein the power amplifier comprises a third stage having a third RF transistor, and wherein the first internal decoupling capacitor is further coupled to a drain of the third RF transistor.

4. The power amplifier of claim 1, wherein the first internal decoupling capacitor comprises a single layer capacitor.

5. The power amplifier of claim 1, wherein the RF transistor comprises a Group III-nitride based high electron mobility transistor.

6. The power amplifier of claim 1, wherein the first internal decoupling capacitor has a capacitance of 10 nF or less.

7. The power amplifier of claim 1, wherein the first internal decoupling capacitor has a voltage rating greater than 50 V.

8. The power amplifier of claim 1, wherein the power amplifier has a peak output power greater than 37 dBm at an operating frequency between 26.5 GHz and 40 GHz.

9. The power amplifier of claim 1, wherein the power amplifier has a peak output power greater than 37 dBm at an operating frequency between 27 GHz and 31 GHz.

10. The power amplifier of claim 1, wherein the power amplifier has a intermodulation distortion product of less than -20 dB over a tone spacing from 0.1 GHz to 300 MHz.

11. The power amplifier of claim 1, wherein the power amplifier has a video bandwidth greater than 300 MHz at an operating frequency between 26.5 GHz and 40 GHz.

12. The power amplifier of claim 1, wherein the second internal decoupling capacitor is a single layer capacitor.

13. The power amplifier of claim 1, wherein the power amplifier comprises a multi-stage amplifier including a first stage and a second stage, wherein the RF transistor comprises a first RF transistor in the first stage of the power amplifier and the power amplifier further comprises a second RF transistor in the second stage of the power amplifier, wherein the first internal decoupling capacitor and the internal second decoupling capacitor are further connected to a drain of the second RF transistor.

14. The power amplifier of claim 13, wherein the power amplifier comprises a third stage having a third RF transistor, and wherein the first and second decoupling capacitors are further connected to a drain of the third RF transistor.

15. A method of forming a power amplifier, comprising:
mounting a monolithic microwave integrated circuit (MMIC) die on a submount, the MMIC die comprising an RF transistor configured to operate at frequencies greater than 26.5 GHz;
mounting a first internal decoupling capacitor on the submount, wherein the decoupling capacitor has a capacitance greater than 2 nF;
mounting a second internal decoupling capacitor on the submount, wherein the second internal decoupling capacitor has a capacitance greater than 2 nF; and
connecting the first and second internal decoupling capacitors to a drain of the RF transistor, wherein the first and second internal decoupling capacitors are on opposite sides of the RF transistor.

16. The method of claim 15, wherein the power amplifier comprises a multi-stage amplifier including a first stage and a second stage, wherein the RF transistor comprises a first RF transistor in the first stage of the power amplifier and the power amplifier further comprises a second RF transistor in the second stage of the power amplifier, the method further comprising connecting the first internal decoupling capacitor to a drain of the second RF transistor.

17. A power amplifier comprising:
a submount;
a monolithic microwave integrated circuit (MMIC) die on the submount, the MMIC die comprising an RF transistor configured to operate at frequencies greater than 26.5 GHZ, an input matching circuit coupled to a gate of the RF transistor, and an output matching circuit coupled to a drain of the RF transistor;
a first internal decoupling capacitor on the submount and connected to the drain of the RF transistor, wherein the first internal decoupling capacitor has a capacitance greater than 2 nF; and
a second internal decoupling capacitor coupled to a drain of the RF transistor, wherein the second internal decoupling capacitor has a capacitance greater than 2 nF;
wherein the first and second internal decoupling capacitors are on opposite sides of the RF transistor.

* * * * *